US011233530B2

(12) United States Patent
Wu et al.

(10) Patent No.: US 11,233,530 B2
(45) Date of Patent: Jan. 25, 2022

(54) WIRELESS COMMUNICATION WITH POLAR CODES USING A MASK SEQUENCE FOR FROZEN BITS

(71) Applicant: QUALCOMM Incorporated, San Diego, CA (US)

(72) Inventors: Gaojin Wu, Beijing (CN); Chao Wei, Beijing (CN); Jing Jiang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/475,344

(22) PCT Filed: Jun. 29, 2017

(86) PCT No.: PCT/CN2017/090893
§ 371 (c)(1),
(2) Date: Jul. 1, 2019

(87) PCT Pub. No.: WO2018/126624
PCT Pub. Date: Jul. 12, 2018

(65) Prior Publication Data
US 2020/0195276 A1   Jun. 18, 2020

(30) Foreign Application Priority Data

Jan. 5, 2017 (WO) ............... PCT/CN2017/070234

(51) Int. Cl.
*H03M 13/25* (2006.01)
*H04W 76/11* (2018.01)
(Continued)

(52) U.S. Cl.
CPC ......... *H03M 13/251* (2013.01); *H03M 13/13* (2013.01); *H04W 72/0446* (2013.01); *H04W 76/11* (2018.02)

(58) Field of Classification Search
CPC .... H03M 13/251; H03M 13/13; H04W 76/11; H04W 72/0446; H04L 1/0057
(Continued)

(56) References Cited

U.S. PATENT DOCUMENTS 8,948,097 B2   2/2015   Chen et al.
2013/0111291 A1*   5/2013   Ma ..................... H04L 1/0026
                                                                          714/752
(Continued)

FOREIGN PATENT DOCUMENTS

CN   103220001 A   7/2013
CN   104038234 A   9/2014
(Continued)

OTHER PUBLICATIONS

Huawei et al., "Details of the Polar Code Design", 3GPP TSG RAN WG1 Meeting #87, R1-1611254, Nov. 14, 2016, 15 pages.
(Continued)

*Primary Examiner* — Esaw T Abraham
*Assistant Examiner* — Enam Ahmed
(74) *Attorney, Agent, or Firm* — Loza & Loza, LLP/Qualcomm

(57) ABSTRACT

Wireless communication devices are adapted to facilitate information sequences included in frozen sub-channels of polar coded transmissions. According to one example, an apparatus can generate a mask sequence based on a plurality of parameters, including at least one of a transmitting-device-specific sequence or a receiving-device-specific sequence. In some examples, the frozen bits may be masked with the mask sequence, and an information block may be encoded utilizing polar coding. In other examples, the mask sequence may be compared to the frozen bits of a received
(Continued)

information block, and the received information block may be determined as intended for the apparatus when the mask sequence matches to the frozen bits. Other aspects, embodiments, and features are also included.

28 Claims, 8 Drawing Sheets

(51) Int. Cl.
*H03M 13/13* (2006.01)
*H04W 72/04* (2009.01)

(58) Field of Classification Search
USPC .......................................................... 714/752
See application file for complete search history.

(56) References Cited

U.S. PATENT DOCUMENTS

| | | | |
|---|---|---|---|
| 2013/0283116 A1* | 10/2013 | Arikan | H03M 13/1148 714/752 |
| 2014/0019820 A1* | 1/2014 | Vardy | H03M 13/13 714/752 |
| 2015/0194987 A1* | 7/2015 | Li | H03M 13/13 714/752 |
| 2015/0333775 A1 | 11/2015 | Korb et al. | |
| 2016/0013810 A1 | 1/2016 | Gross et al. | |
| 2016/0164629 A1 | 6/2016 | Ahn et al. | |
| 2016/0192420 A1* | 6/2016 | Kim | H04W 74/002 370/329 |
| 2016/0380763 A1 | 12/2016 | Ahn et al. | |
| 2018/0048418 A1* | 2/2018 | Ge | H04L 1/0038 |
| 2018/0351579 A1* | 12/2018 | Hong | H03M 13/13 |
| 2020/0196286 A1* | 6/2020 | Shelby | H04W 72/042 |

FOREIGN PATENT DOCUMENTS

| | | |
|---|---|---|
| CN | 105075163 A | 11/2015 |
| CN | 106027068 A | 10/2016 |
| CN | 106027071 A | 10/2016 |
| WO | 2011041544 A2 | 4/2011 |

OTHER PUBLICATIONS

Huawei et al., "Evaluation of Channel Coding Schemes for Control Channel", 3GPP TSG RAN WG1 Meeting #86b, R1-1608863, Oct. 14, 2016, 4 pages.
International Search Report and Written Opinion—PCT/CN2017/070234—ISA/EPO—dated Sep. 29, 2017.
International Search Report and Written Opinion—PCT/CN2017/090893—ISA/EPO—dated Sep. 30, 2017.
Hisilicon H: "Performance Evaluation of Channel Coding Schemes for Control Channel", 3GPP Draft, 3GPP TSG RAN WG1 Meeting #87, R1-1611257 Evaluation of Channel Coding Schemes for Control Channel, 3RD Generation Partnership Project (3GPP), Mobile Competence Centre, 650, Route Des Lucioles, F-06921, Sophia-Antipoli, vol. RAN WG1, No. Reno, USA, Nov. 14, 2016-Nov. 18, 2016 Nov. 13, 2016 (Nov. 13, 2016), XP051175238,11 Pages, Retrieved from the Internet: URL:http://www.3gpp.org/ftp/Meetings_3GPP_SYNC/RAN1/Docs/ [retrieved on Nov. 13, 2016].
Supplementary European Search Report—EP17890316—Search Authority—Munich—Jul. 17, 2020.
Taiwan Search Report—TW107100311—TIPO—Feb. 10, 2021.

\* cited by examiner

WIRELESS COMMUNICATION WITH POLAR CODES USING A MASK SEQUENCE FOR FROZEN BITS

CROSS-REFERENCE TO RELATED APPLICATION(S)

This application is the U.S. national stage of PCT patent application number PCT/CN2017/090893 filed on Jun. 29, 2017, which claims priority to and the benefit of PCT patent application number PCT/CN2017/070234 filed on Jan. 5, 2017, the content of each of which is incorporated herein by reference.

TECHNICAL FIELD

The technology discussed below relates generally to information communication systems, and more particularly, to channel coding utilizing polar codes in communication systems. Embodiments can provide and enable techniques for utilizing an information sequence in frozen sub-channels to reduce error detection rates and false alarm rates.

INTRODUCTION

A polar code is a linear block code, or error correcting code, which has been shown to achieve channel capacity of symmetric binary-input discrete memoryless channels. That is, polar codes achieve the channel capacity (the Shannon limit) or the theoretical upper bound on the amount of error-free information that can be transmitted on a discrete memoryless channel of a given bandwidth in the presence of noise. Due to its performance capabilities, the $3^{rd}$ Generation Partnership Project (3GPP) has agreed to adopt polar coding as the channel coding scheme for certain control channel signaling.

As the demand for mobile broadband access continues to increase, research and development continue to advance wireless communication technologies not only to meet the growing demand for mobile broadband access, but to advance and enhance the user experience with mobile communications.

BRIEF SUMMARY OF SOME EXAMPLES

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

One or more aspects of the present disclosure are directed to apparatus for wireless communication. According to at least one example, an apparatus for wireless communication may include a transceiver, a memory, and at least one processing circuit communicatively coupled to the transceiver and the memory. The at least one processing circuit may be adapted to generate an information block, which includes information bits and frozen bits. The at least one processing circuit may further be adapted to generate a mask sequence based on a plurality of parameters, such as a transmitting-device-specific sequence and/or a receiving-device-specific sequence. The at least one processing circuit may further be adapted to mask the frozen bits with the mask sequence, encode the information block utilizing polar coding, and transmit the encoded information block via the transceiver.

One or more further aspects of the present disclosure include methods operational on a wireless communication device as well as apparatus including means to perform such methods. One or more examples of such methods may include generating an information block including information bits and frozen bits. A mask sequence may be generated based on a plurality of parameters. The plurality of parameters can include a transmitting-device-specific sequence and/or a receiving-device-specific sequence. The frozen bits may be masked with the mask sequence, and the information block may be encoded utilizing polar coding. The encoded information block may then be transmitted.

Still further aspects of the present disclosure include computer-readable storage mediums storing processor-executable programming. In at least one example, the processor-executable programming may be adapted to cause a processing circuit to generate an information block comprising information bits and frozen bits. The processor-executable programming may further be adapted to cause a processing circuit to generate a mask sequence based on a plurality of parameters, such as a transmitting-device-specific sequence and/or a receiving-device-specific sequence. The processor-executable programming may further be adapted to cause a processing circuit to mask the frozen bits with the mask sequence, encode the information block utilizing polar coding, and transmit the encoded information block.

Additional aspects of the present disclosure include apparatus for wireless communication. According to at least one example, an apparatus for wireless communication may include a transceiver, a memory, and at least one processing circuit communicatively coupled to the transceiver and the memory. The at least one processing circuit may be adapted to receive via the transceiver a polar-coded information block including information bits and frozen bits. The at least one processing circuit may further be adapted to generate a mask sequence based on a plurality of parameters, such as a transmitting-device-specific sequence and/or a receiving-device-specific sequence. The at least one processing circuit may further be adapted to compare the mask sequence to the frozen bits of the received information block, and determine the received information block is intended for the apparatus when the mask sequence matches to the frozen bits of the received information block.

One or more further aspects of the present disclosure include methods operational on a wireless communication device as well as apparatus including means to perform such methods. One or more examples of such methods may include receiving a polar-coded information block including information bits and frozen bits. A mask sequence may be generated based on a plurality of parameters, such as a transmitting-device-specific sequence and/or a receiving-device-specific sequence. The mask sequence may be compared to the frozen bits of the received information block, and a determination can be made that the received information block is intended for the apparatus when the mask sequence matches to the frozen bits of the received information block.

Still further aspects of the present disclosure include computer-readable storage mediums storing processor-executable programming. In at least one example, the processor-executable programming may be adapted to cause a processing circuit to receive a polar-coded information block including information bits and frozen bits. The processor-executable programming may further be adapted to cause a processing circuit to generate a mask sequence based on a plurality of parameters, such as a transmitting-device-specific sequence and/or a receiving-device-specific sequence. The processor-executable programming may further be adapted to cause a processing circuit to compare the mask sequence to the frozen bits of the received information block, and determine the received information block is intended for the apparatus when the mask sequence matches to the frozen bits of the received information block.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

DRAWINGS

DETAILED DESCRIPTION

The description set forth below in connection with the appended drawings is intended as a description of various configurations and is not intended to represent the only configurations in which the concepts and features described herein may be practiced. The following description includes specific details for the purpose of providing a thorough understanding of various concepts. However, it will be apparent to those skilled in the art that these concepts may be practiced without these specific details. In some instances, well known circuits, structures, techniques and components are shown in block diagram form to avoid obscuring the described concepts and features.

The various concepts presented throughout this disclosure may be implemented across a broad variety of telecommunication systems, network architectures, and communication standards. As one non-limiting example, certain aspects of the disclosure will be described with reference to a fifth-generation (5G) New Radio (NR) wireless communication network. Generally, NR refers to 5G technologies and the new radio access technology undergoing definition and standardization by the third generation partnership project (3GPP) in Release 15.

Figure 1:
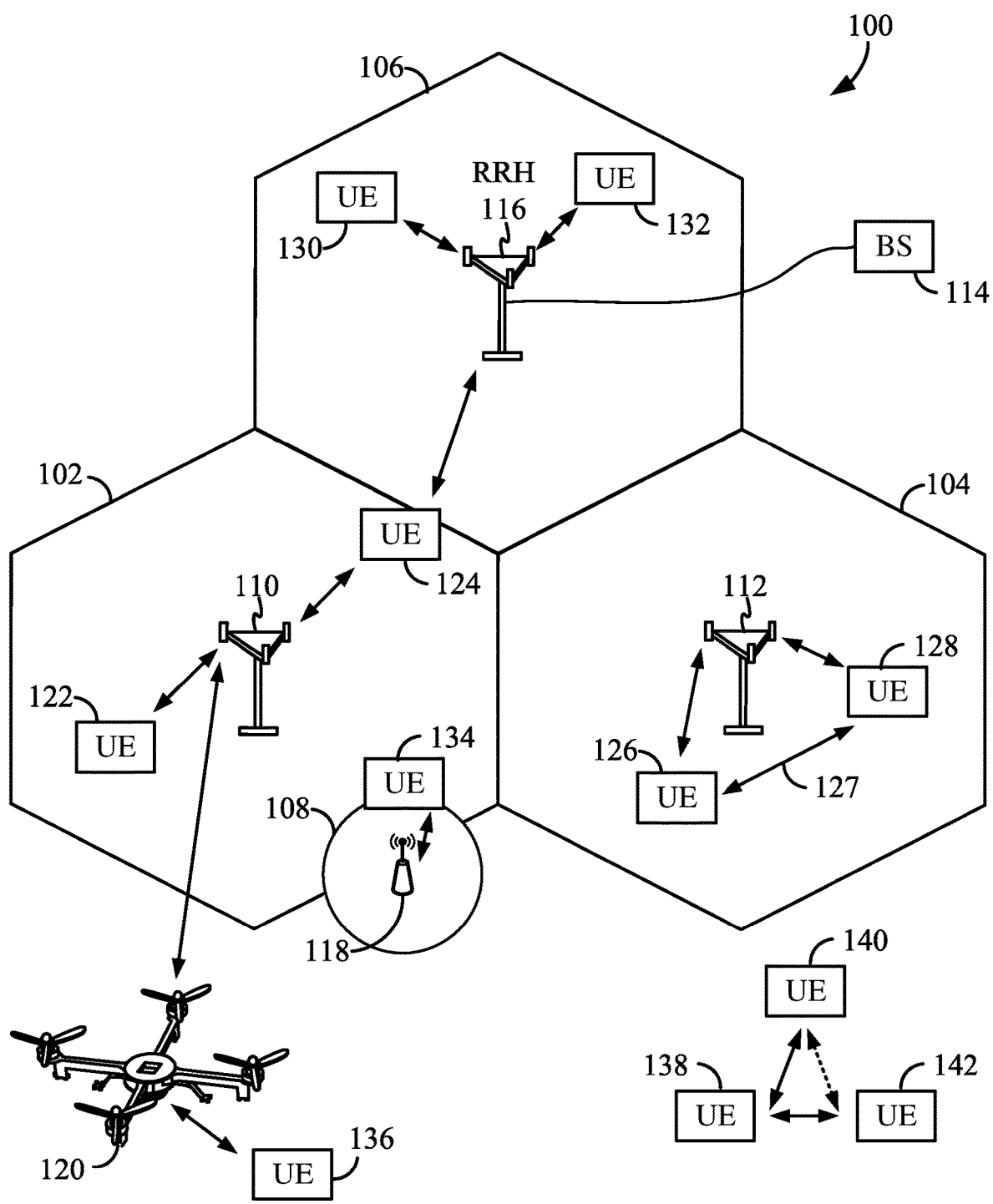
FIG. 1 is a block diagram of a network environment in which one or more aspects of the present disclosure may find application.

Referring now to FIG. 1, as an illustrative example without limitation, a block diagram of a network environment in which one or more aspects of the present disclosure may find application is provided. The access network 100 is adapted to facilitate wireless communication between two or more wireless communication devices.

The geographic region covered by the access network 100 may be divided into a number of cellular regions (cells) that can be uniquely identified by a user equipment (UE) based on an identification broadcasted over a geographical area from one access point or base station. FIG. 1 illustrates macrocells 102, 104, and 106, and a small cell 108, each of which may include one or more sectors. A sector is a sub-area of a cell. All sectors within one cell are served by the same base station. A radio link within a sector can be identified by a single logical identification belonging to that sector. In a cell that is divided into sectors, the multiple sectors within a cell can be formed by groups of antennas with each antenna responsible for communication with UEs in a portion of the cell.

In general, a base station (BS) serves each cell. Broadly, a base station is a network element in a radio access network responsible for radio transmission and reception in one or more cells to or from a UE. A base station may also be referred to by those skilled in the art as a base transceiver station (BTS), a radio base station, a radio transceiver, a transceiver function, a basic service set (BSS), an extended service set (ESS), an access point (AP), a Node B (NB), an eNode B (eNB), gNB, or some other suitable terminology.

In FIG. 1, two high-power base stations 110 and 112 are shown in cells 102 and 104, and a third high-power base station 114 is shown controlling a remote radio head (RRH) 116 in cell 106. That is, a base station can have an integrated antenna or can be connected to an antenna or RRH by feeder cables. In the illustrated example, the cells 102, 104, and 106 may be referred to as macrocells, as the high-power base stations 110, 112, and 114 support cells having a large size. Further, a low-power base station 118 is shown in the small cell 108 (e.g., a microcell, picocell, femtocell, home base station, home Node B, home eNode B, etc.) which may overlap with one or more macrocells. In this example, the cell 108 may be referred to as a small cell, as the low-power base station 118 supports a cell having a relatively small size. Cell sizing can be done according to system design as well as component constraints. It is to be understood that the access network 100 may include any number of wireless base stations and cells. Further, a relay node may be deployed to extend the size or coverage area of a given cell.

The base stations 110, 112, 114, 118 provide wireless access points to a core network for any number of mobile apparatuses.

FIG. 1 further includes a quadcopter or drone 120, which may be configured to function as a base station. That is, in some examples, a cell may not necessarily be stationary, and the geographic area of the cell may move according to the location of a mobile base station such as the quadcopter 120.

In general, base stations may include a backhaul interface for communication with a backhaul portion of the network. The backhaul may provide a link between a base station and a core network, and in some examples, the backhaul may provide interconnection between the respective base stations. The core network is a part of a wireless communication system that is generally independent of the radio access technology used in the radio access network. Various types of backhaul interfaces may be employed, such as a direct physical connection, a virtual network, or the like using any suitable transport network. Some base stations may be configured as integrated access and backhaul (IAB) nodes, where the wireless spectrum may be used both for access links (i.e., wireless links with UEs), and for backhaul links. This scheme is sometimes referred to as wireless self-backhauling. By using wireless self-backhauling, rather than requiring each new base station deployment to be outfitted with its own hard-wired backhaul connection, the wireless spectrum utilized for communication between the base station and UE may be leveraged for backhaul communication, enabling fast and easy deployment of highly dense small cell networks.

The access network 100 is illustrated supporting wireless communication for multiple mobile apparatuses. A mobile apparatus is commonly referred to as user equipment (UE) in standards and specifications promulgated by the 3rd Generation Partnership Project (3GPP), but may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology. A UE may be an apparatus that provides a user with access to network services.

Within the present document, a "mobile" apparatus need not necessarily have a capability to move, and may be stationary. The term mobile apparatus or mobile device broadly refers to a diverse array of devices and technologies. For example, some non-limiting examples of a mobile apparatus include a mobile, a cellular (cell) phone, a smart phone, a session initiation protocol (SIP) phone, a laptop, a personal computer (PC), a notebook, a netbook, a smartbook, a tablet, a personal digital assistant (PDA), and a broad array of embedded systems, e.g., corresponding to an "Internet of things" (IoT). A mobile apparatus may additionally be an automotive or other transportation vehicle, a remote sensor or actuator, a robot or robotics device, a satellite radio, a global positioning system (GPS) device, an object tracking device, a drone, a multi-copter, a quadcopter, a remote control device, a consumer and/or wearable device, such as eyewear, a wearable camera, a virtual reality device, a smart watch, a health or fitness tracker, a digital audio player (e.g., MP3 player), a camera, a game console, etc. A mobile apparatus may additionally be a digital home or smart home device such as a home audio, video, and/or multimedia device, an appliance, a vending machine, intelligent lighting, a home security system, a smart meter, etc.

A mobile apparatus may additionally be a smart energy device, a security device, a solar panel or solar array, a municipal infrastructure device controlling electric power (e.g., a smart grid), lighting, water, etc.; an industrial automation and enterprise device; a logistics controller; agricultural equipment; military defense equipment, vehicles, aircraft, ships, and weaponry, etc. Still further, a mobile apparatus may provide for connected medicine or telemedicine support, i.e., health care at a distance. Telehealth devices may include telehealth monitoring devices and telehealth administration devices, whose communication may be given preferential treatment or prioritized access over other types of information, e.g., in terms of prioritized access for transport of critical service data, and/or relevant QoS for transport of critical service data.

Within the access network 100, the cells may include UEs that may be in communication with one or more sectors of each cell. For example, UEs 122 and 124 may be in communication with base station 110, UEs 126 and 128 may be in communication with base station 112, UEs 130 and 132 may be in communication with base station 114 by way of RRH 116, UE 134 may be in communication with low-power base station 118, and UE 136 may be in communication with mobile base station 120. Here, each base station 110, 112, 114, 118, and 120 may be configured to provide an access point to a core network (not shown) for all the UEs in the respective cells.

In another example, a mobile network node (e.g., quadcopter 120) may be configured to function as a UE. For example, the quadcopter 120 may operate within cell 102 by communicating with base station 110. In some aspects of the disclosure, two or more UEs (e.g., UEs 126 and 128) may communicate with each other using peer to peer (P2P) or sidelink signals 127 without relaying that communication through a base station (e.g., base station 112).

In some examples, access to the air interface may be scheduled, wherein a scheduling entity (e.g., a base station) allocates resources for communication among some or all devices and equipment within its service area or cell. Within the present disclosure, as discussed further below, the scheduling entity may be responsible for scheduling, assigning, reconfiguring, and releasing resources for one or more scheduled entities. That is, for scheduled communication, UEs or scheduled entities utilize resources allocated by the scheduling entity.

Base stations are not the only entities that may function as a scheduling entity. That is, in some examples, a UE may function as a scheduling entity, scheduling resources for one or more scheduled entities (e.g., one or more other UEs). In other examples, sidelink signals may be used between UEs without necessarily relying on scheduling or control information from a base station. For example, UE 138 is illustrated communicating with UEs 140 and 142. In some examples, the UE 138 is functioning as a scheduling entity or a primary sidelink device, and UEs 140 and 142 may function as a scheduled entity or a non-primary (e.g., secondary) sidelink device. In still another example, a UE may function as a scheduling entity in a device-to-device (D2D), peer-to-peer (P2P), or vehicle-to-vehicle (V2V) network, and/or in a mesh network. In a mesh network example, UEs 140 and 142 may optionally communicate directly with one another in addition to communicating with the scheduling entity 138.

Figure 2:
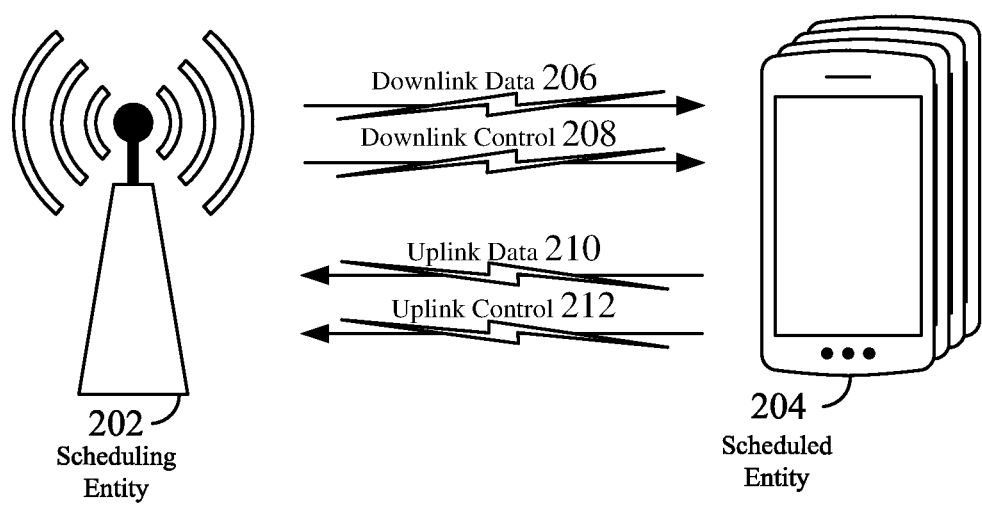
FIG. 2 is a block diagram conceptually illustrating an example of a scheduling entity communicating with one or more scheduled entities according to some embodiments.

Thus, in a wireless communication network with scheduled access to time-frequency resources and having a cellular configuration, a P2P configuration, or a mesh configuration, a scheduling entity and one or more scheduled entities may communicate utilizing the scheduled resources. Referring now to FIG. 2, a block diagram illustrates a scheduling entity 202 and a scheduled entity 204. Here, the scheduling entity 202 may correspond to a base station 110, 112, 114, and/or 118. In additional examples, the scheduling entity 202 may correspond to a UE 138, the quadcopter 120, or any other suitable node in the access network 100. Similarly, in various examples, the scheduled entity 204 may correspond to the UE 122, 124, 126, 128, 130, 132, 134, 136, 138, 140, and 142, or any other suitable node in the access network 100.

As illustrated in FIG. 2, the scheduling entity 202 may broadcast traffic 206 to one or more scheduled entities 204, which traffic may be referred to as downlink traffic. In accordance with certain aspects of the present disclosure, the term downlink may refer to a point-to-multipoint transmission originating at the scheduling entity 202. Broadly, the scheduling entity 202 is a node or device responsible for scheduling traffic in a wireless communication network, including the downlink transmissions and, in some examples, uplink traffic 210 from one or more scheduled entities to the scheduling entity 202. Another way to describe the system may be to use the term broadcast channel multiplexing. In accordance with aspects of the present disclosure, the term uplink may refer to a point-to-point transmission originating at a scheduled entity 204. Broadly, the scheduled entity 204 is a node or device that receives scheduling control information, including but not limited to scheduling grants, synchronization or timing information, or other control information from another entity in the wireless communication network such as the scheduling entity 202.

Uplink traffic 210 and/or downlink traffic 206 may additionally be transmitted between the scheduling entity 202 and the scheduled entity 204. Transmissions of the control and traffic information may be organized by subdividing a carrier, in time, into suitable transmission time intervals (TTIs). Additionally, the scheduling entity 202 may broadcast control information 208 to one or more scheduled entities 204, and the scheduled entity 204 may transmit uplink control information 212 to the scheduling entity 202.

The channels or carriers illustrated in FIG. 2 are not necessarily all of the channels or carriers that may be utilized between a scheduling entity 202 and scheduled entities 204, and those of ordinary skill in the art will recognize that other channels or carriers may be utilized in addition to those illustrated, such as other traffic, control, and feedback channels.

Figure 3:
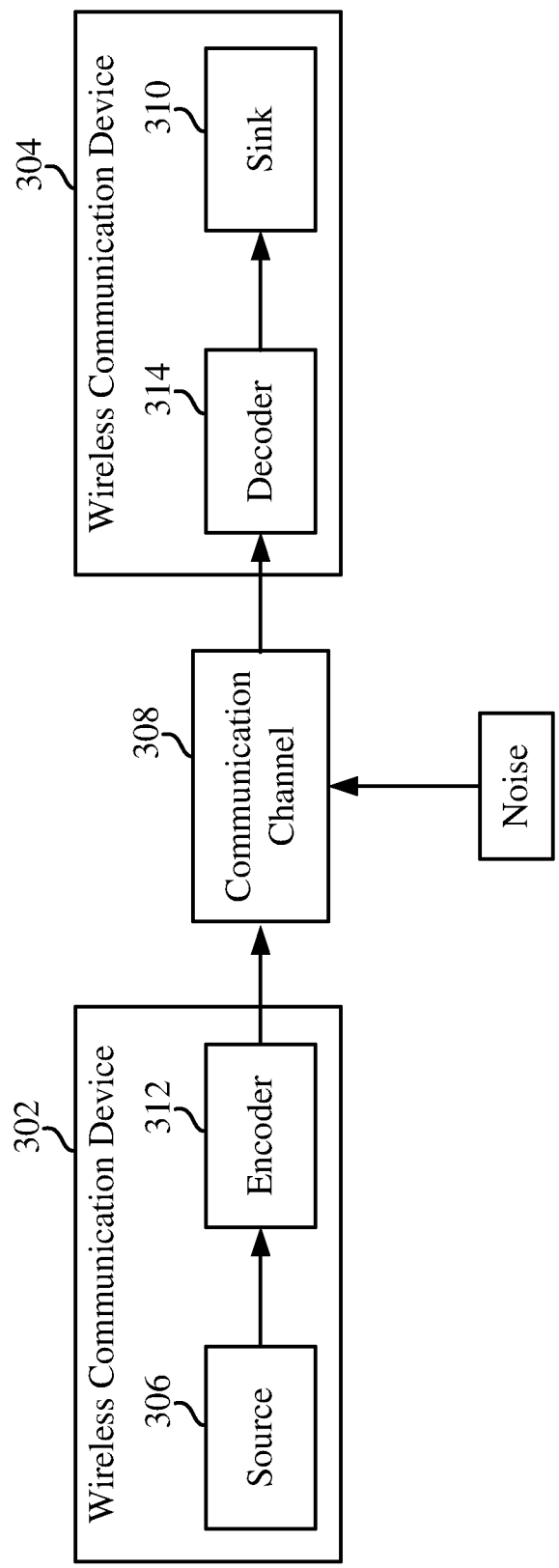
FIG. 3 is a block diagram illustrating wireless communication between a first wireless communication device and a second wireless communication device according to at least one example.

As wireless communication devices (e.g., scheduling entities, scheduled entities) communicate within an access network, the various devices may utilize an error correcting block code to facilitate reliable transmission of digital messages over a noisy channel. For example, FIG. 3 is a block diagram illustrating wireless communication between a first wireless communication device 302 and a second wireless communication device 304. Each wireless communication device 302 and 304 may be a user equipment (UE), a base station, or any other suitable apparatus or means for wireless communication. Of course, this illustration omits some of the components in such a wireless communication device, and only some of the functional blocks are illustrated for simplicity. In the illustrated example, a source 306 within the first wireless communication device 302 transmits a digital message over a communication channel 308 (e.g., a wireless channel) to a sink 310 in the second wireless communication device 304. One issue in such a scheme that must be addressed to provide for reliable communication of the digital message is to take into account the noise that affects the communication channel 308.

Block codes, or error correcting codes are frequently used to provide reliable transmission of digital messages over such noisy channels. In a typical block code, an information message or sequence is split up into blocks, each block having a length of K bits. An encoder 312 at the first (transmitting) wireless communication device 302 then mathematically adds redundancy to the information message, resulting in codewords having a length of N, where N>K. Here, the coding rate R is the ratio between the $$R = \frac{K}{N}.$$

message length and the block length: i.e., Exploitation of this redundancy in the encoded information message is the key to reliability of the message, enabling correction for any bit errors that may occur due to the noise. That is, a decoder 314 at the second (receiving) wireless communication device 304 can take advantage of the redundancy to reliably recover the information message even though bit errors may occur, in part, due to the addition of noise to the channel.

Many examples of such error correcting codes are known to those of ordinary skill in the art, including Hamming codes, Bose-Chaudhuri-Hocquenghem (BCH) codes, turbo codes, and low-density parity check (LDPC) codes, among others. Many existing wireless communication networks utilize such codes, such as 3GPP LTE networks, which utilize turbo codes; and IEEE 802.11n Wi-Fi networks, which utilize LDPC codes. However, for 5G NR networks, a new category of block codes, called polar codes, are being adopted as the channel coding scheme for certain control channel transmissions. Polar codes can provide reliable and efficient information transfer.

Polar codes are linear block error correcting codes invented in 2007 by Erdal Arikan, and currently known to those skilled in the art. Polar codes can achieve the channel capacity (the Shannon limit) or the theoretical upper bound on the amount of error-free information that can be transmitted on a discrete memoryless channel of a given bandwidth in the presence of noise.

In general, channel polarization is generated based on multiple recursive concatenation of a kernel code, transforming an information block or data word u having information bits $u_0 \ldots u_{N-1}$ into a code word x having coded bits $x_0 \ldots x_{N-1}$. Here, $u_0 \ldots u_{N-1}$ represents a sequence of input bits of a vector u in the U domain, and $x_0 \ldots x_{N-1}$ represents a sequence of output bits of a vector x in the X domain for transmission over the communication channel 506. Each input bit u is also called a sub-channel i.

These input bits u may include different categories or sets of bits, which may be referred to as U domain bits. These U domain bits may include information bits (the information being communicated), frozen bits, and in some examples, parity check bits. The output bits x are coded bits, which may also be referred to as X domain bits.

When decoding polar codes, the decoder 314 generally utilizes successive cancellation (SC) decoding, and generates an estimate of the error probability for each input bit in the U domain Due to the nature of channel polarization, some of the sub-channels will transmit bits with a very high reliability (e.g., an error probability close to zero), while other sub-channels will transmit bits with a low reliability (e.g., an error probability close to 0.5). Sub-channels with high reliability are generally chosen for transmission of the information bits, while sub-channels with low reliability are generally set to a predetermined value (e.g., zero), and are called frozen bits. Thus, the estimate of the error probability may be omitted for the frozen bits.

Conventional implementations of polar codes generally set the frozen bits to zero. However, this choice is not a requirement and essentially any sequence may be applied to the frozen bits while achieving the same block error rate performance as the value of zero for the frozen bits.

Figure 4:
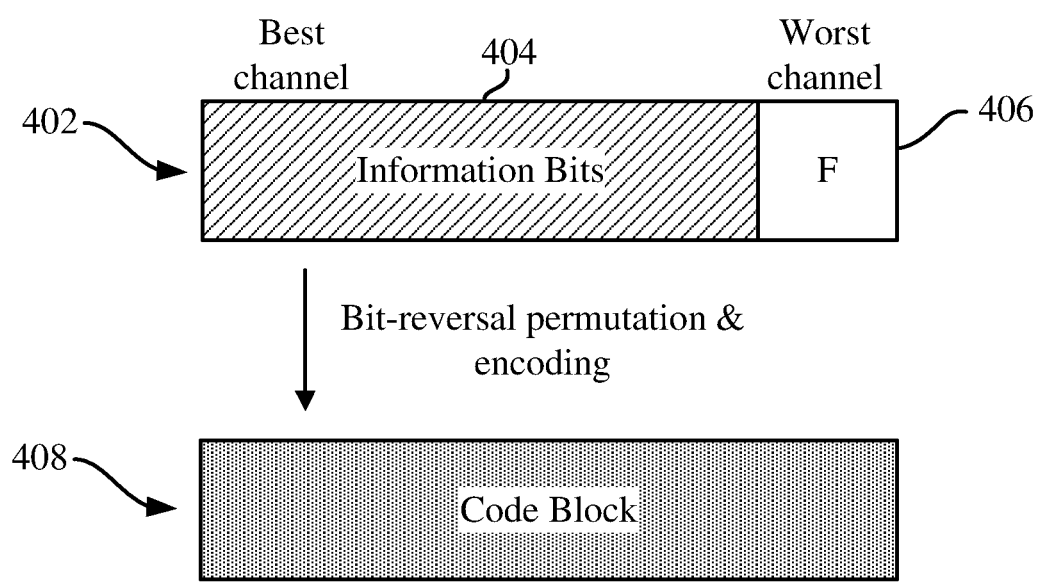
FIG. 4 is a block diagram illustrating a polar coding algorithm as it may be implemented according to some aspects of the disclosure.

Referring now to FIG. 4, a block diagram is shown illustrating a polar coding algorithm as it may be implemented according to some aspects of the disclosure. As illustrated, an information block 402 for polar coding includes a plurality of information bits 404 and a plurality of frozen bits 406. The information block 402 may have a length N, such that the information bits 404 correspond to the K good sub-channels, and the frozen bits 406 correspond to the N-K bad sub-channels, and are thus each fixed with a predetermined value. In the example shown in FIG. 4, the information bits 404 are sorted from the best to worst sub-channels. After bit-reversal permutation and encoding in accordance with a polar coding algorithm, a polar code block 408 is obtained. The polar code block 408 may then be transmitted to a receiving device in a first transmission.

When all UEs apply the same values (e.g., zeros) to their respective frozen sub-channels, a false alarm may occur. Here, a false alarm may refer to an event wherein a UE incorrectly detects that a signal was addressed or directed to that UE, when in fact the signal was addressed or directed to some other UE or destination. For example, a base station may transmit a signal to a $UE_A$. A $UE_B$ may receive this transmitted signal and may attempt to determine whether the signal is directed to the $UE_B$. In some examples, a cyclic redundancy check (CRC) may be used to determine whether the signal is directed to the $UE_B$. For example, the base station may combine the information bits with the UE-ID of the destination UE (i.e., $UE_A$) for calculation of a CRC, which may then be appended to the signal. Accordingly, when the $UE_B$ receives and decodes the signal, the $UE_B$ may combine the received information bits with the $UE_B$'s own UE-ID to calculate CRC bits. Here, if the calculated CRC bits match the received CRC bits, then the $UE_B$ may determine that the signal is directed to the $UE_B$. If the calculated CRC bits do not match, then the $UE_B$ may determine that the signal is not directed to the $UE_B$. In the event that the $UE_B$ incorrectly calculates a matching CRC even though the signal was in fact directed to the $UE_A$, this would constitute a false alarm.

According to one or more aspects of the present disclosure, a UE-specific sequence (e.g., the UE-ID) may be applied to the frozen bits. This way, when the $UE_B$ receives the signal, the $UE_B$ may check the frozen bits and determine whether the UE-ID matches the $UE_B$'s UE-ID. In this way, the $UE_B$ may determine that the received signal is not for the $UE_B$. Again, in the event that the $UE_B$ incorrectly determines that the frozen bits match UEB's UE-ID, this would constitute a false alarm.

In one particular example, a UE-ID (e.g., a radio network temporary identifier or RNTI) may be utilized as a mask sequence to apply to the frozen bits. The number of frozen bits in a code block may be dynamic, and may depend on factors such as the block size, the information bit size, etc. However, the length of the UE-ID may generally be fixed. Accordingly, repetition and/or truncation of the UE-ID may be applied to fill out the full set of frozen bits.

Although utilizing such UE-specific sequences across the frozen sub-channels can help in reducing false alarms, error detection and false alarm rates may still be less than optimal. For example, in general, a base station may randomly allocate UE IDs to different users. In this case, it may be likely that different UEs can have a similar binary format for their respective UE-IDs. In other words, relatively few bits of the respective UE-IDs may be different among different UEs. Moreover, two UEs communicating with two different base stations may in some cases actually have exactly the same UE-ID as one another.

In this case, if the UE-ID were utilized for masking the frozen bits, the resulting frozen bit sequence for different UEs can be very similar, or even the same. Accordingly, when decoding the polar coded codeword, the SC path metric may be small even though a UE is decoding another UE's codeword. Thus, the false alarm rate may be increased.

According to an aspect of the present disclosure, rather than directly using the UE-ID as a mask sequence, increased randomness may be introduced to the sequence applied to the frozen sub-channels. For example, along with the UE-specific information, one or more additional parameters may be utilized to determine a sequence to apply to the frozen sub-channels. For example, this set of parameters may include UE-specific information such as the UE-ID (e.g., an RNTI). The set of parameters may further include cell-specific and/or network-specific information such as a cell ID. The set of parameters may further include time-related information such as a slot number or subframe number, a clock value, etc. The set of parameters may further include control signal format information such as an information block size. The set of parameters may further include any other suitable parameter. The selected parameters may be combined in any suitable fashion, e.g., by concatenating or interleaving their sequences.

By including the cell-specific information, differentiation may be enabled even for UEs that happen to be assigned the same UE-ID by nearby cells. Further, by including time-specific information such as the slot number or subframe number, even if a collision or false alarm occurs in one subframe, such collisions or false alarms may be reduced or prevented in the next or subsequent subframes.

In a further aspect, a random sequence generator (e.g., a pseudo-random number generator) may be utilized to generate a mask sequence to apply to the frozen bits. Here, the random sequence generator may be initialized for every subframe or slot. Any suitable random sequence generator may be utilized within the scope of the present disclosure. In this example, the pseudo-random number generator may generate a sequence according to a deterministic function such that a receiving device may reproduce the same sequence based on the same inputs.

In a further aspect, an initialization seed for the pseudo-random number generator may depend on a set of one or more parameters, such as the UE-specific information, cell-specific information, and/or time-related information.

In one particular example, a UE ID, a cell ID, and a subframe number may be combined to generate an initialization seed $c_{init}$ for a pseudo-random sequence generator according to the following formula in Equation 1:

$$c_{init} = \left(\left\lfloor \frac{n_s}{2} \right\rfloor + 1\right) \cdot (2N_{ID}^{cell} + 1) \cdot 2^{16} + n_{RNTI} \quad (1)$$

Here, $n_s$ represents a subframe number or slot number, $N_{ID}^{cell}$ represents a cell ID, and $n_{RNTI}$ represents a UE-ID. A similar equation can be found utilized in LTE networks to initialize a random number generation algorithm, although in a different context, as LTE networks do not utilize polar coding.

Figure 5:
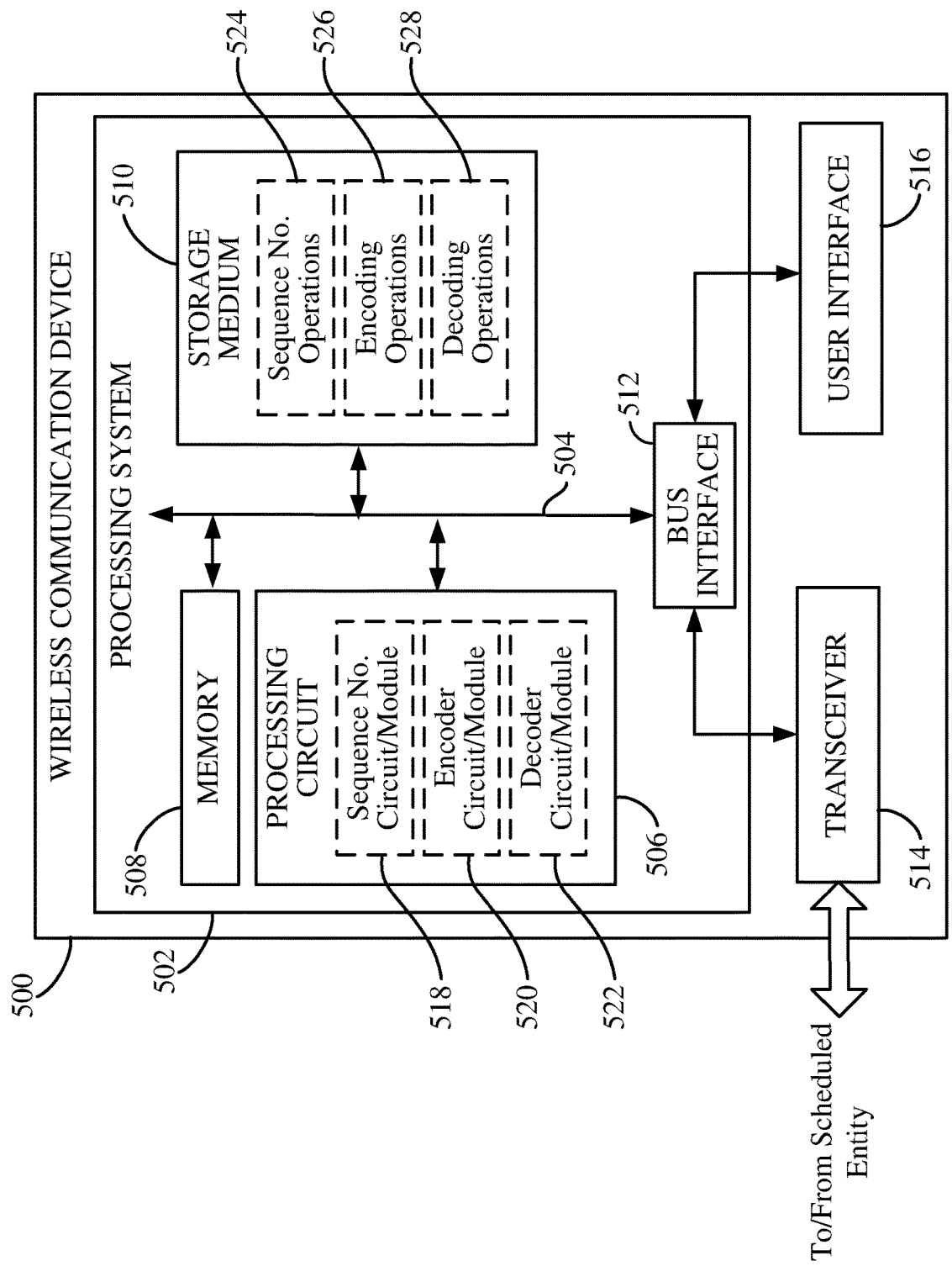
FIG. 5 is a block diagram illustrating select components of a wireless communication device employing a processing system according to at least one example of the present disclosure.

FIG. 5 is a block diagram illustrating select components of a wireless communication device 500 employing a processing system 502 according to at least one example of the present disclosure. The wireless communication device 500 may be representative of any one or more of the various base stations, UEs, scheduling entities and/or scheduled entities described herein above. As depicted in FIG. 5, the processing system 502 may implemented with a bus architecture, represented generally by the bus 504. The bus 504 may include any number of interconnecting buses and bridges depending on the specific application of the processing system 502 and the overall design constraints. The bus 504 communicatively couples together various circuits including one or more processors (represented generally by the processing circuit 506), a memory 508, and computer-readable media (represented generally by the storage medium 510). The bus 504 may also link various other circuits such as timing sources, peripherals, voltage regulators, and power management circuits, which are well known in the art, and therefore, will not be described any further. A bus interface 512 provides an interface between the bus 504 and a transceiver 514. The transceiver 514 provides a means for communicating with various other apparatus over a transmission medium. Depending upon the nature of the apparatus, a user interface 516 (e.g., keypad, display, speaker, microphone, joystick) may also be provided.

The processing circuit 506 is responsible for managing the bus 504 and general processing, including the execution of programming stored on the computer-readable storage medium 510. The programming, when executed by the processing circuit 506, causes the processing system 502 to perform the various functions described below for any particular apparatus. The computer-readable storage medium 510 and the memory 508 may also be used for storing data that is manipulated by the processing circuit 506 when executing programming. As used herein, the term "programming" shall be construed broadly to include without limitation instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

The processing circuit 506 is arranged to obtain, process and/or send data, control data access and storage, issue commands, and control other desired operations. The processing circuit 506 may include circuitry adapted to implement desired programming provided by appropriate media, and/or circuitry adapted to perform one or more functions described in this disclosure. For example, the processing circuit 506 may be implemented as one or more processors, one or more controllers, and/or other structure configured to execute executable programming and/or execute specific functions. Examples of the processing circuit 506 may include a general purpose processor, a digital signal processor (DSP), an application specific integrated circuit (ASIC), a field programmable gate array (FPGA) and/or other programmable logic component, discrete gate or transistor logic, discrete hardware components, or any combination thereof designed to perform the functions described herein. A general purpose processor may include a microprocessor, as well as any conventional processor, controller, microcontroller, or state machine. The processing circuit 506 may also be implemented as a combination of computing components, such as a combination of a DSP and a microprocessor, a number of microprocessors, one or more microprocessors in conjunction with a DSP core, an ASIC and a microprocessor, or any other number of varying configurations. These examples of the processing circuit 506 are for illustration and other suitable configurations within the scope of the present disclosure are also contemplated.

In some instances, the processing circuit 506 may include a sequence number circuit and/or module 518, an encoder circuit and/or module 520, and a decoder circuit and/or module 522. The sequence number circuit/module 518 may generally include circuitry and/or programming (e.g., programming stored on the storage medium 510) adapted to generate a sequence number that may be applied as a mask to the frozen bits in a polar-coded code block. The encoder circuit/module 520 may generally include circuitry and/or programming (e.g., programming stored on the storage medium 510) adapted to encode an information block utilizing polar coding applying the sequence number from the sequence number circuit/module 518 as a mask for the frozen bits in the code block. The decoder circuit/module 520 may generally include circuitry and/or programming (e.g., programming stored on the storage medium 510) adapted to decode a polar-coded code bock and to utilize the sequence number from the sequence number circuit/module 518 to determine whether a received polar-coded code bock is intended for the wireless communication device 500. As used herein, reference to circuitry and/or programming may be generally referred to as logic (e.g., logic gates and/or data structure logic).

The storage medium 510 may represent one or more computer-readable devices for storing programming, such as processor executable code or instructions (e.g., software, firmware), electronic data, databases, or other digital information. The storage medium 510 may also be used for storing data that is manipulated by the processing circuit 506 when executing programming. The storage medium 510 may be any available non-transitory media that can be accessed by a general purpose or special purpose processor, including portable or fixed storage devices, optical storage devices, and various other mediums capable of storing, containing and/or carrying programming By way of example and not limitation, the storage medium 510 may include a non-transitory computer-readable storage medium such as a magnetic storage device (e.g., hard disk, floppy disk, magnetic strip), an optical storage medium (e.g., compact disk (CD), digital versatile disk (DVD)), a smart card, a flash memory device (e.g., card, stick, key drive), random access memory (RAM), read only memory (ROM), programmable ROM (PROM), erasable PROM (EPROM), electrically erasable PROM (EEPROM), a register, a removable disk, and/or other mediums for storing programming, as well as any combination thereof.

The storage medium 510 may be coupled to the processing circuit 506 such that the processing circuit 506 can read information from, and write information to, the storage medium 510. That is, the storage medium 510 can be coupled to the processing circuit 506 so that the storage medium 510 is at least accessible by the processing circuit 506, including examples where the storage medium 510 is integral to the processing circuit 506 and/or examples where the storage medium 510 is separate from the processing circuit 506 (e.g., resident in the processing system 502, external to the processing system 502, distributed across multiple entities).

Programming stored by the storage medium 510, when executed by the processing circuit 506, can cause the processing circuit 506 to perform one or more of the various functions and/or process steps described herein. In at least some examples, the storage medium 510 may include sequence number operations 524, encoding operations 526, and/or decoding operations 528. The sequence number operations 524 are generally adapted to cause the processing circuit 506 to generate a sequence number, as described herein. The encoding operations 526 are generally adapted to cause the processing circuit 506 to encode an information block utilizing polar coding and applying a generated sequence number as a mask for the frozen bits in the code block, as described herein. The decoding operations 528 are generally adapted to cause the processing circuit 506 to decode a polar-coded code bock and to utilize a generated sequence number to determine whether a received polar-coded code block is intended for the wireless communication device 500, as described herein.

Thus, according to one or more aspects of the present disclosure, the processing circuit 506 is adapted to perform (independently or in conjunction with the storage medium 510) any or all of the processes, functions, steps and/or routines for any or all of the wireless communication devices described herein (e.g., base station 110, 112, 114, 118; quadcopter 120; UE 122, 124, 126, 128, 130, 132, 134, 136, 138, 140, 142; scheduling entity 202; and scheduled entity 204). As used herein, the term "adapted" in relation to the processing circuit 506 may refer to the processing circuit 506 being one or more of configured, employed, implemented, and/or programmed (in conjunction with the storage medium 510) to perform a particular process, function, step and/or routine according to various features described herein.

Figure 6:
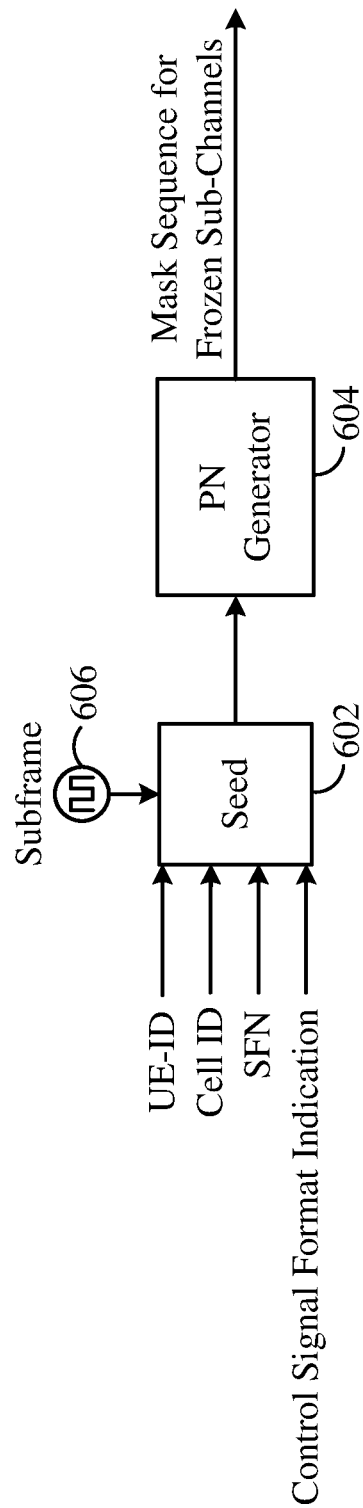
FIG. 6 is a block diagram depicting at least one example of a portion of a sequence number algorithm according to one or more aspects of the present disclosure.

FIG. 6 is a block diagram depicting at least one example of a portion of a sequence number algorithm that may be implemented by the sequence number circuit/module 518 and/or the sequence number operations 524 to generate a sequence number according to one or more aspects of the present disclosure.

As shown, block 602 can generate an initialization seed $c_{init}$ to be utilized by a pseudo-random sequence generator 604. For example, Equation 1, given above, may be carried out at block 602. As illustrated, the initialization seed may take as input parameters a UE-ID, a cell ID, and/or a subframe number, as one example. In another example, the initialization seed may take one or more input parameters, such as a control signal format indication. Further, the initialization seed may be reset or re-initialized at each subframe by, for example, a subframe clock 606. The pseudo-random sequence generator 604 may utilize any suitable algorithm, including but not limited to Gold codes, known to those of ordinary skill in the art.

The output of the pseudo-random sequence generator 604 may be a pseudo-random sequence, and may be applied as a mask to the frozen bits in a polar-coded code block. This output pseudo-random sequence may be employed by the encoder circuit/module 520 and/or the encoding operations 526 in the case that the wireless communication device 500 is sending a polar-coded transmission to another device, or by the decoder circuit/module 522 and/or decoding operations 528 in the case that the wireless communication device 500 is receiving a polar-coded transmission from another device.

Figure 7:
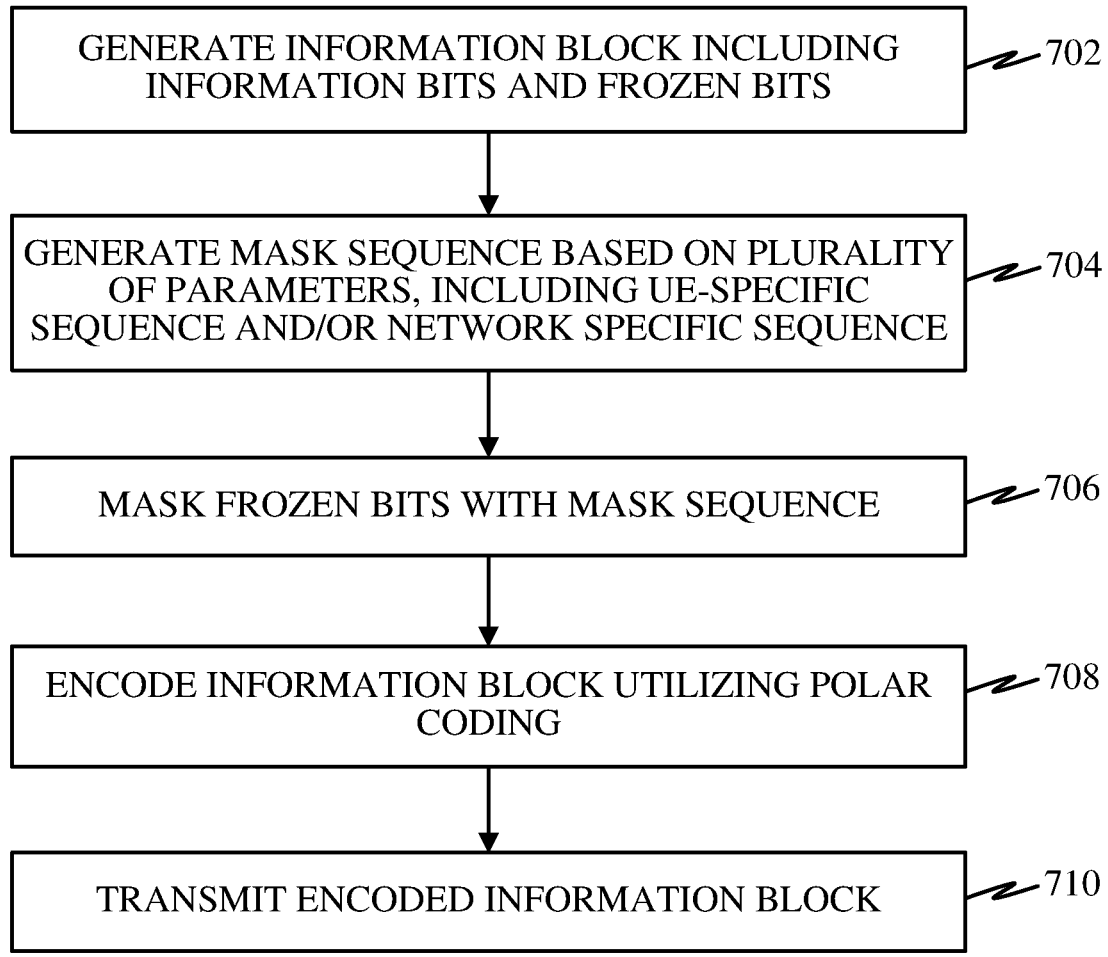
FIG. 7 is a flow diagram illustrating at least one example of a method operational on a wireless communication device.

FIG. 7 is a flow diagram illustrating at least one example of a method operational on a wireless communication device, such as the wireless communication device 500. The example illustrated by FIG. 7 may be applicable to a transmitting wireless communication device 500. Referring to FIGS. 5 and 7, the transmitting wireless communication device 500 may generate an information block including information bits and frozen bits at 702. For example, the wireless communication device 500 may include logic (e.g., processing circuit 506, storage medium 510) adapted to generate an information block that includes information bits and frozen bits.

At 704, the wireless communication device 500 can generate a mask sequence based on a plurality of parameters, including a transmitting-device-specific sequence and/or a receiving-device-specific sequence. For example, the wireless communication device 500 may include logic (e.g., sequence number circuit/module 518, sequence number operations 524) adapted to generate the mask sequence based on the plurality of parameters.

In at least one implementation, the plurality of parameters may include the transmitting-device-specific sequence, the receiving-device-specific sequence, and time-related information. The transmitting-device-specific sequence may be either a UE-ID or a cell ID, while the receiving-device-specific sequence can be the other of the UE-ID or a cell ID. For example, the transmitting-device-specific sequence may be a UE-ID if the transmitting device is a UE, and the transmitting-device-specific sequence may be a cell ID if the transmitting device is a base station. Similarly, the receiving-device-specific sequence may be a UE-ID if the receiving device is a UE, and the receiving-device-specific sequence may be a cell ID if the receiving device is a base station. In one or more examples, the time-related information may be a subframe number or a slot number.

In one or more implementations, the mask sequence may be generated by determining an initialization seed $c_{init}$ based on the various parameters, and then generating the mask sequence utilizing a pseudo-random sequence generator based on the initialization seed $c_{init}$. For example, the wireless communication device 500 can include logic (e.g., sequence number circuit/module 518, sequence number operations 524, block 602 in FIG. 6) adapted to determine the initialization seed $c_{init}$ based on the various parameters. In at least one example, the logic may be adapted to determine the initialization seed $c_{init}$ based on a calculation of Equation 1, above.

With the initialization seed $c_{init}$ determined, the wireless communication device 500 can include logic (sequence number circuit/module 518, sequence number operations 524, pseudo-random sequence generator 604 in FIG. 6) adapted to generate the mask sequence utilizing a pseudo-random sequence generator based at least in part on the determined initialization seed $c_{init}$.

At 706, the wireless communication device 500 can mask the frozen bits with the mask sequence generated at 704. For example, the wireless communication device 500 may include logic (e.g., sequence number circuit/module 518, sequence number operations 524) adapted to mask the frozen bits with the generated mask sequence.

At 708, the wireless communication device 500 can encode the information block utilizing polar coding. For example, the wireless communication device 500 may include logic (e.g., encoder circuit/module 520, encoder operations 526) adapted to encode the information block utilizing polar coding.

At 710, the transmitting wireless communication device 500 can transmit the encoded information block. For example, the wireless communication device 500 may include logic (e.g., processing circuit 506, programming stored on storage medium 510) adapted to wirelessly transmit the encoded information block via the transceiver 514.

Figure 8:
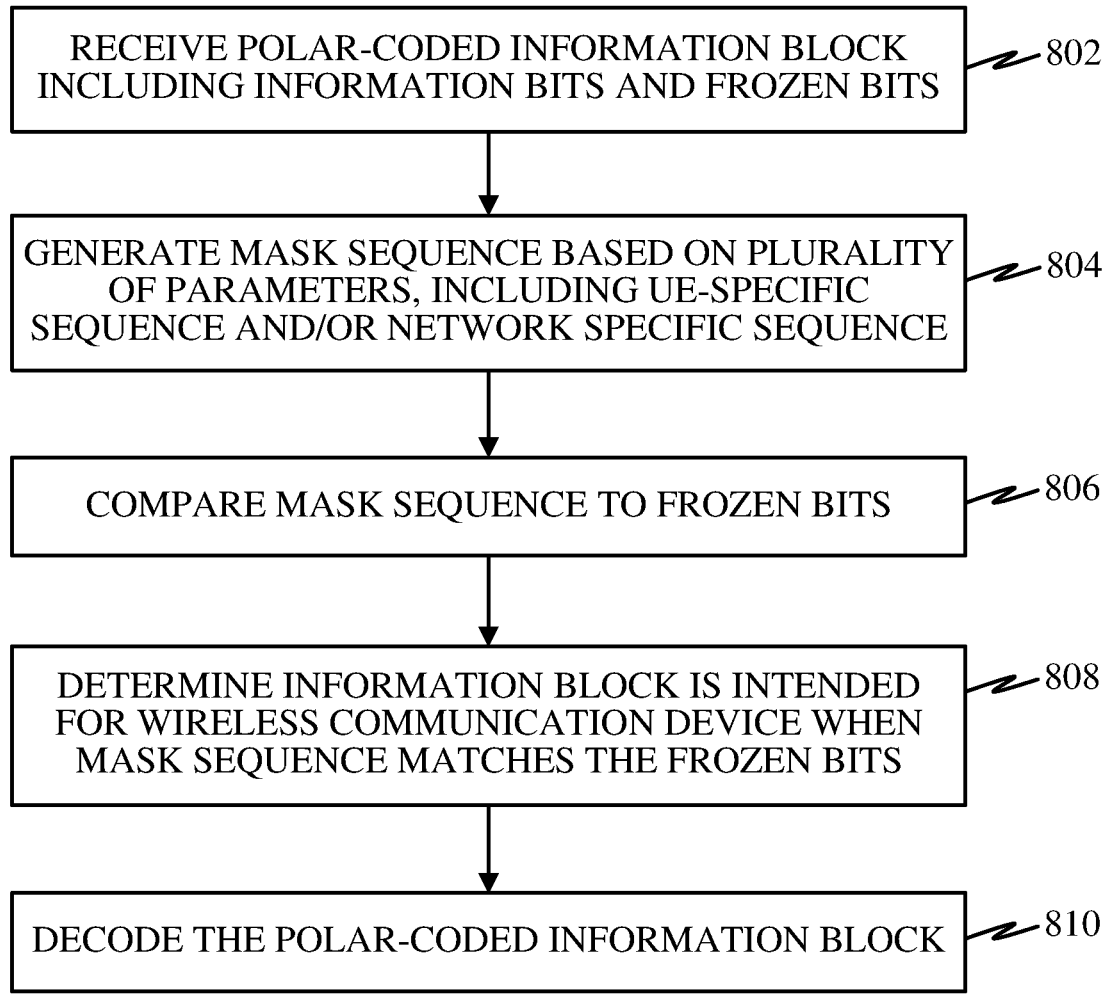
FIG. 8 is a flow diagram illustrating at least one example of another method operational on a wireless communication device.

Turning now to FIG. 8, a flow diagram is shown illustrating at least one example of another method operational on a wireless communication device, such as the wireless communication device 500. The example illustrated by FIG. 8 may be applicable to a receiving wireless communication device 500. Referring to FIGS. 5 and 8, the receiving wireless communication device 500 may receive a polar-coded information block including information bits and frozen bits at 802. For example, the wireless communication device 500 may include logic (e.g., processing circuit 506, storage medium 510) adapted to receive a polar-coded information block via the transceiver 514.

At 804, the wireless communication device 500 may generate a mask sequence based on a plurality of parameters, including a transmitting-device-specific sequence and/or a receiving-device-specific sequence. For example, the wireless communication device 500 may include logic (e.g., sequence number circuit/module 518, sequence number operations 524) adapted to generate the mask sequence based on the plurality of parameters.

In at least one implementation, the plurality of parameters may include the transmitting-device-specific sequence, the receiving-device-specific sequence, and time-related information. The transmitting-device-specific sequence may be either a UE-ID or a cell ID, while the receiving-device-specific sequence can be the other of the UE-ID or a cell ID. For example, the transmitting-device-specific sequence may be a UE-ID if the transmitting device is a UE, and the transmitting-device-specific sequence may be a cell ID if the transmitting device is a base station. Similarly, the receiving-device-specific sequence may be a UE-ID if the receiving device is a UE, and the receiving-device-specific sequence may be a cell ID if the receiving device is a base station. In one or more examples, the time-related information may be a subframe number or a slot number.

In one or more implementations, the mask sequence may be generated by determining an initialization seed $c_{init}$ based on the various parameters, and then generating the mask sequence utilizing a pseudo-random sequence generator based on the initialization seed $c_{init}$. For example, the wireless communication device 500 can include logic (e.g., sequence number circuit/module 518, sequence number operations 524, block 602 in FIG. 6) adapted to determine the initialization seed $c_{init}$ based on the various parameters. In at least one example, the logic may be adapted to determine the initialization seed $c_{init}$ based on a calculation of Equation 1, above.

With the initialization seed $c_{init}$ determined, the wireless communication device 500 can include logic (sequence number circuit/module 518, sequence number operations 524, pseudo-random sequence generator 604 in FIG. 6) adapted to generate the mask sequence utilizing a pseudo-random sequence generator based at least in part on the determined initialization seed $c_{init}$.

At 806, the wireless communication device 500 can compare the mask sequence to the frozen bits of the received information block. For example, the wireless communication device 500 can include logic (sequence number circuit/module 518, sequence number operations 524) adapted to compare the generated mask sequence to the frozen bits of the received information block.

At 808, the wireless communication device 500 can determine the received information block is intended for the wireless communication device 500 when the mask sequence matches to the frozen bits of the received information block. For example, the wireless communication device 500 can include logic (processing circuit 506, programming stored on storage medium 510) adapted to determine that the received information block is intended for the wireless communication device 500 when the mask sequence matches to the frozen bits of the received information block. Similarly, the logic (processing circuit 506, programming stored on storage medium 510) can be adapted to determine that the received information block is not intended for the wireless communication device 500 when the mask sequence does not match to the frozen bits of the received information block.

At 810, the wireless communication device 500 can decode the polar-coded information block. For example, the wireless communication device 500 can include logic (decoder circuit/module 522, decoder operations 528) adapted to decode the polar-coded information block.

Several aspects of a wireless communication network have been presented with reference to an exemplary implementation. As those skilled in the art will readily appreciate, various aspects described throughout this disclosure may be extended to other telecommunication systems, network architectures and communication standards.

By way of example, various aspects may be implemented within other systems defined by 3GPP, such as Long-Term Evolution (LTE), the Evolved Packet System (EPS), the Universal Mobile Telecommunication System (UMTS), and/or the Global System for Mobile (GSM). Various aspects may also be extended to systems defined by the 3rd Generation Partnership Project 2 (3GPP2), such as CDMA2000 and/or Evolution-Data Optimized (EV-DO). Other examples may be implemented within systems employing IEEE 802.11 (Wi-Fi), IEEE 802.16 (WiMAX), IEEE 802.20, Ultra-Wideband (UWB), Bluetooth, and/or other suitable systems. The actual telecommunication standard, network architecture, and/or communication standard employed will depend on the specific application and the overall design constraints imposed on the system.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in FIGS. 1-8 may be rearranged and/or combined into a single component, step, feature or function or embodied in several components, steps, or functions. Additional elements, components, steps, and/or functions may also be added without departing from novel features disclosed herein. The apparatus, devices, and/or components illustrated in FIGS. 1-8 may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. An apparatus for wireless communication, comprising:
a transceiver;
a memory; and
at least one processing circuit communicatively coupled to the transceiver and the memory, the at least one processing circuit to:
generate an information block comprising information bits and frozen bits;
generate a mask sequence based, at least in part, on a plurality of parameters, the plurality of parameters comprising at least two parameters selected from a set of parameters comprising a transmitting-device-specific sequence, a receiving-device-specific sequence, and at least one parameter based on time-related information;
mask the frozen bits with the mask sequence;
encode the information block utilizing polar coding; and
transmit the encoded information block via the transceiver.

2. The apparatus of claim 1, wherein the plurality of parameters further comprises:
all three of the transmitting-device-specific sequence, the receiving-device-specific sequence, and the at least one parameter based on the time-related information.

3. The apparatus of claim 2, wherein the plurality of parameters further comprises control signal format information, and
wherein the transmitting-device-specific sequence and the receiving-device-specific sequence comprise a UE-ID and a cell ID, and the time-related information comprises a subframe number or slot number.

4. The apparatus of claim 1, wherein the at least one processing circuit adapted to generate a mask sequence based on a plurality of parameters comprises the at least one processing circuit adapted to:
determine an initialization seed ($c_{init}$) based on the plurality of parameters; and
generate the mask sequence utilizing a pseudo-random sequence generator based on the initialization seed.

5. The apparatus of claim 4, wherein the plurality of parameters comprises:
the transmitting-device-specific sequence including one of a UE-ID ($n_{RNTI}$) and a cell ID ($N_{ID}^{cell}$);
the receiving-device-specific sequence including the other of the UE-ID ($n_{RNTI}$) and the cell ID ($N_{ID}^{cell}$); and
a value determined from time-related information ($n_s$).

6. The apparatus of claim 5, wherein the value determined from the time-related information ($n_s$) comprises a subframe number or a slot number.

7. The apparatus of claim 5, wherein the at least one processing circuit adapted to determine the initialization seed ($c_{init}$) based on the plurality of parameters comprises the at least one processing circuit adapted to:

calculate a value for $c_{init} = \left(\left\lfloor \frac{n_s}{2} \right\rfloor + 1\right) \cdot (2N_{ID}^{cell} + 1) \cdot 2^{16} + n_{RNTI}$.

8. A method operational on a wireless communication device, comprising:
generating an information block comprising information bits and frozen bits;
generating a mask sequence based, at least in part, on a plurality of parameters, the plurality of parameters comprising at least two parameters selected from a set of parameters comprising a transmitting-device-specific sequence, a receiving-device-specific sequence, and at least one parameter based on time-related information;
masking the frozen bits with the mask sequence;
encoding the information block utilizing polar coding; and
transmitting the encoded information block.

9. The method of claim 8, wherein generating the mask sequence based on a plurality of parameters comprises:
determining an initialization seed ($c_{init}$) based on the plurality of parameters; and
generating the mask sequence utilizing a pseudo-random sequence generator based on the initialization seed.

10. The method of claim 9, wherein the plurality of parameters comprises:
the transmitting-device-specific sequence including one of a UE-ID ($n_{RNTI}$) and a cell ID ($N_{ID}^{cell}$);
the receiving-device-specific sequence including the other of the UE-ID ($n_{RNTI}$) and the cell ID ($N_{ID}^{cell}$); and
a value determined from time-related information ($n_s$).

11. The method of claim 10, wherein the value determined from the time-related information ($n_s$) comprises a subframe number or a slot number.

12. The method of claim 10, wherein determining the initialization seed ($c_{init}$) based on the plurality of parameters comprises:

calculating a value for $c_{init} = \left(\left\lfloor \frac{n_s}{2} \right\rfloor + 1\right) \cdot (2N_{ID}^{cell} + 1) \cdot 2^{16} + n_{RNTI}$.

13. The method of claim 8, wherein generating the mask sequence further comprises:
generating the mask sequence based, at least in part, on all three of the transmitting-device-specific sequence, the receiving-device-specific sequence, and the at least one parameter based on time-related information.

14. The method of claim 13, wherein the plurality of parameters further comprises control signal format information, and
wherein the transmitting-device-specific sequence and the receiving-device-specific sequence comprise a UE-ID and a cell ID, and the time-related information comprises a subframe number or slot number.

15. An apparatus for wireless communication, comprising:
a transceiver;
a memory; and
at least one processing circuit communicatively coupled to the transceiver and the memory, the at least one processing circuit adapted to:
receive via the transceiver a polar-coded information block comprising information bits and frozen bits;
generate a mask sequence based, at least in part, on a plurality of parameters, the plurality of parameters comprising at least two parameters selected from a set of parameters comprising a transmitting-device-specific sequence, a receiving-device-specific sequence, and at least one parameter based on time-related information;
compare the mask sequence to the frozen bits of the received information block; and
determine the received information block is intended for the apparatus when the mask sequence matches to the frozen bits of the received information block.

16. The apparatus of claim 15, wherein the plurality of parameters further comprises all three of the transmitting-device-specific sequence, the receiving-device-specific sequence, and the at least one parameter based on time-related information.

17. The apparatus of claim 16, wherein the plurality of parameters further comprises control signal format information, and
wherein the transmitting-device-specific sequence and the receiving-device-specific sequence comprise a UE-ID and a cell ID, and the time-related information comprises a subframe number or slot number.

18. The apparatus of claim 15, wherein the at least one processing circuit adapted to generate a mask sequence based on a plurality of parameters comprises the at least one processing circuit adapted to:
determine an initialization seed ($c_{init}$) based on the plurality of parameters; and
generate the mask sequence utilizing a pseudo-random sequence generator based on the initialization seed.

19. The apparatus of claim 18, wherein the plurality of parameters comprises:
the transmitting-device-specific sequence including one of a UE-ID ($n_{RNTI}$) and a cell ID ($N_{ID}^{cell}$);
the receiving-device-specific sequence including the other of the UE-ID ($n_{RNTI}$) and the cell ID ($N_{ID}^{cell}$); and
a value determined from time-related information ($n_s$).

20. The apparatus of claim 19, wherein the at least one processing circuit adapted to determine the initialization seed ($c_{init}$) based on the plurality of parameters comprises the at least one processing circuit adapted to:

calculate the value for $c_{init} = \left(\left\lfloor \frac{n_s}{2} \right\rfloor + 1\right) \cdot (2N_{ID}^{cell} + 1) \cdot 2^{16} + n_{RNTI}$.

21. The apparatus of claim 19, wherein the value determined from the time-related information ($n_s$) comprises a subframe number or a slot number.

22. A method operational on a wireless communication device, comprising:
receiving a polar-coded information block comprising information bits and frozen bits;
generating a mask sequence based, at least in part, on a plurality of parameters, the plurality of parameters comprising at least two parameters selected from a set of parameters comprising a transmitting-device-specific sequence, a receiving-device-specific sequence, and at least one parameter based on time-related information;
comparing the mask sequence to the frozen bits of the received information block; and
determining the received information block is intended for the apparatus when the mask sequence matches to the frozen bits of the received information block.

23. The method of claim 22, wherein generating the mask sequence based on a plurality of parameters comprises:
determining an initialization seed ($c_{init}$) based on the plurality of parameters; and
generating the mask sequence utilizing a pseudo-random sequence generator based on the initialization seed.

24. The method of claim 23, wherein the plurality of parameters comprises:
the transmitting-device-specific sequence including one of a UE-ID ($n_{RNTI}$) and a cell ID ($N_{ID}^{cell}$);
the receiving-device-specific sequence including the other of the UE-ID ($n_{RNTI}$) and the cell ID ($N_{ID}^{cell}$); and
a value determined from time-related information ($n_s$).

25. The method of claim 24, wherein determining the initialization seed ($c_{init}$) based on the plurality of parameters comprises:

calculating a value for $c_{init} = \left(\left\lfloor \frac{n_s}{2} \right\rfloor + 1\right) \cdot (2N_{ID}^{cell} + 1) \cdot 2^{16} + n_{RNTI}$.

26. The method of claim 24, wherein the value determined from the time-related information ($n_s$) comprises a subframe number or a slot number.

27. The method of claim 22, wherein generating the mask sequence based on the plurality of parameters further comprises:
generating the mask sequence based on all three of the transmitting-device-specific sequence, the receiving-device-specific sequence, and the at least one parameter based on time-related information.

28. The method of claim 27, wherein the plurality of parameters further comprises control signal format information, and
 wherein the transmitting-device-specific sequence and the receiving-device-specific sequence comprise a UE-ID and a cell ID, and the time-related information comprises a subframe number or slot number.

\* \* \* \* \*